US 12,451,844 B2

United States Patent
Komatsuzaki et al.

(10) Patent No.: US 12,451,844 B2
(45) Date of Patent: Oct. 21, 2025

(54) DOHERTY AMPLIFIER

(71) Applicant: Mitsubishi Electric Corporation, Tokyo (JP)

(72) Inventors: Yuji Komatsuzaki, Tokyo (JP); Shuichi Sakata, Tokyo (JP); Shintaro Shinjo, Tokyo (JP); Hiroshi Otsuka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 519 days.

(21) Appl. No.: 17/960,938

(22) Filed: Oct. 6, 2022

(65) Prior Publication Data
US 2023/0029039 A1    Jan. 26, 2023

Related U.S. Application Data

(63) Continuation of application No. PCT/JP2020/022180, filed on Jun. 4, 2020.

(51) Int. Cl.
  *H03F 1/02*   (2006.01)
  *H03F 1/56*   (2006.01)
  *H03F 3/24*   (2006.01)

(52) U.S. Cl.
  CPC .......... *H03F 1/0288* (2013.01); *H03F 1/56* (2013.01); *H03F 3/245* (2013.01); *H03F 2200/222* (2013.01); *H03F 2200/387* (2013.01)

(58) Field of Classification Search
  CPC .......... H03F 1/0288; H03F 1/56; H03F 3/245; H03F 2200/222; H03F 2200/387
  (Continued)

(56) References Cited

U.S. PATENT DOCUMENTS 8,502,599 B2 * 8/2013 Conradi ............... H03F 1/0288
                                                             330/126
2013/0099866 A1 * 4/2013 Conradi ............... H03F 1/0288
                                                             330/126
(Continued)

FOREIGN PATENT DOCUMENTS

EP            1912328 B1    9/2011
JP         2009-10484 A    1/2009
(Continued)

OTHER PUBLICATIONS

Andrei Grebenikov et al., High Power High Efficiency GaN HEMT Doherty Amplifiers for Base Station Applications, IEICE Transactions, vol. E104-C, No. 10, Oct. 2021 (Year: 2021).*
(Continued)

*Primary Examiner* — Hafizur Rahman
(74) *Attorney, Agent, or Firm* — Birch, Stewart, Kolasch & Birch, LLP

(57) ABSTRACT

A Doherty amplifier includes: a first amplifier to amplify a first signal as an auxiliary amplifier in a case where a frequency of each of the first signal and a second signal is a first frequency, and amplify the first signal as a main amplifier in a case where the frequency of each of the first signal and the second signal is a second frequency; a second amplifier to amplify the second signal as a main amplifier in a case where the frequency of each of the first signal and the second signal is the first frequency, and amplify the second signal as an auxiliary amplifier in a case where the frequency of each of the first signal and the second signal is the second frequency; and a combiner to synthesize the first signal amplified by the first amplifier and the second signal amplified by the second amplifier.

10 Claims, 10 Drawing Sheets

(58) Field of Classification Search
USPC .......................................................... 330/295
See application file for complete search history.

(56) References Cited

U.S. PATENT DOCUMENTS

| | | | |
|---|---|---|---|
| 2015/0017934 A1* | 1/2015 | Yamaoka | H04B 1/0458 455/114.3 |
| 2020/0091871 A1 | 3/2020 | Nakatani et al. | |
| 2020/0244227 A1* | 7/2020 | Nakatani | H03F 1/56 |
| 2020/0321673 A1* | 10/2020 | Sun | H03F 3/245 |
| 2021/0376798 A1* | 12/2021 | Srinidhi Embar | H01L 23/66 |

FOREIGN PATENT DOCUMENTS

| | | |
|---|---|---|
| JP | 2013-115760 A | 6/2013 |
| JP | 2014-175760 A | 9/2014 |
| JP | 2014-175824 A | 9/2014 |
| WO | WO 2018/138763 A1 | 8/2018 |
| WO | WO 2019/097609 A1 | 5/2019 |

OTHER PUBLICATIONS

Sourav Gupta, "Classes of Power Amplifiers", Circuit Digest, Dec. 11, 2018 (Year: 2018).*
Office Action dated Jan. 24, 2023 issued in corresponding Japanese Patent Application No. 2022-529261 with an English Translation.
Andersson et al., "A 1-3-GHz Digitally Controlled Dual-RF Input Power-Amplifier Design Based on a Doherty-Outphasing Continuum Analysis", IEEE Transactions on Microwave Theory and Techniques, Oct. 2013, vol. 61, No. 10, p. 3743-3752.
International Search Report, issued in PCT/JP2020/022180, PCT/ISA/210, dated Aug. 11, 2020.
Office Action issued in Japanese Patent Application No. 2022-529261 dated Sep. 6, 2022.
Written Opinion of the International Searching Authority, issued in PCT/JP2020/022180, PCT/ISA/237, dated Aug. 11, 2020.
Extended European Search Report for European Application No. 20939046.7, dated May 25, 2023.
Japanese Notice of Reasons for Refusal for Japanese Application No. 2022-529261, dated May 30, 2023, with English translation.

* cited by examiner

DOHERTY AMPLIFIER

CROSS REFERENCE TO RELATED APPLICATIONS

This application is a Continuation of PCT International Application No. PCT/JP2020/022180 filed on Jun. 4, 2020, which is hereby expressly incorporated by reference into the present application.

TECHNICAL FIELD

The present disclosure relates to a Doherty amplifier.

BACKGROUND ART

A Doherty amplifier disclosed in Patent Literature 1 mentioned below includes a distribution circuit, a carrier amplifier, a peak amplifier, a 90-degree line, and a combiner. The saturated output power of the peak amplifier is larger than the saturated output power of the carrier amplifier.

In the Doherty amplifier, since the saturated output power of the peak amplifier is larger than the saturated output power of the carrier amplifier, an output reflection coefficient of the carrier amplifier during the back-off operation is increased as compared to that of a Doherty amplifier in which the saturated output power of the peak amplifier is equal to that of the carrier amplifier. In the above Doherty amplifier, by the increased amount of the output reflection coefficient of the carrier amplifier, the efficiency at the time of the back-off operation is improved as compared to a Doherty amplifier in which the saturated output power of the peak amplifier is equal to that of the carrier amplifier.

CITATION LIST

Patent Literature

Patent Literature 1: JP 2013-115760 A

SUMMARY OF INVENTION

Technical Problem

In the Doherty amplifier disclosed in the Patent Literature 1, the efficiency during the back-off operation is improved in a case where the frequency of a signal to be amplified provided to the distribution circuit (hereinafter, referred to as a "first frequency") has an electrical length, of an output-side line of the carrier amplifier, of 90 degrees due to a 90 degrees line. However, in a case where a signal having a second frequency different from the first frequency is provided to the distribution circuit, the electrical length of the output-side line of the carrier amplifier differs from 90 degrees. With the electrical length of the output-side line of the carrier amplifier being different from 90 degrees, an imaginary component in output impedance of the carrier amplifier increases. Therefore, there is a disadvantage that the efficiency at the time of the back-off operation is reduced in a case where the frequency of the signal to be amplified provided to the distribution circuit is the second frequency.

The present disclosure has been made to solve the above problems, and an object of the present disclosure is to obtain a Doherty amplifier capable of suppressing a decrease in efficiency during back-off operation in a case where the frequency of a signal is a second frequency.

Solution to Problem

A Doherty amplifier according to the present disclosure includes: a first amplifier to amplify a first signal as an auxiliary amplifier in a case where a frequency of each of the first signal and a second signal is a first frequency, and amplify the first signal as a main amplifier in a case where the frequency of each of the first signal and the second signal is a second frequency; a second amplifier to amplify the second signal as a main amplifier in a case where the frequency of each of the first signal and the second signal is the first frequency, and amplify the second signal as an auxiliary amplifier in a case where the frequency of each of the first signal and the second signal is the second frequency; and a combiner to synthesize the first signal amplified by the first amplifier and the second signal amplified by the second amplifier, wherein the second amplifier has a saturated output power which is larger than a saturated output power of the first amplifier, and in a case where the first amplifier amplifies the first signal as the main amplifier and the second amplifier amplifies the second signal as the auxiliary amplifier, the combiner transforms output impedance of the first amplifier so that an imaginary component in the output impedance of the first amplifier is reduced.

Advantageous Effects of Invention

According to the present disclosure, it is possible to suppress a decrease in efficiency during back-off operation in a case where the frequency of a signal is a second frequency.

DESCRIPTION OF EMBODIMENTS

To describe the present disclosure further in detail, embodiments for carrying out the present disclosure will be described below with reference to the accompanying drawings.

First Embodiment

Figure 1:
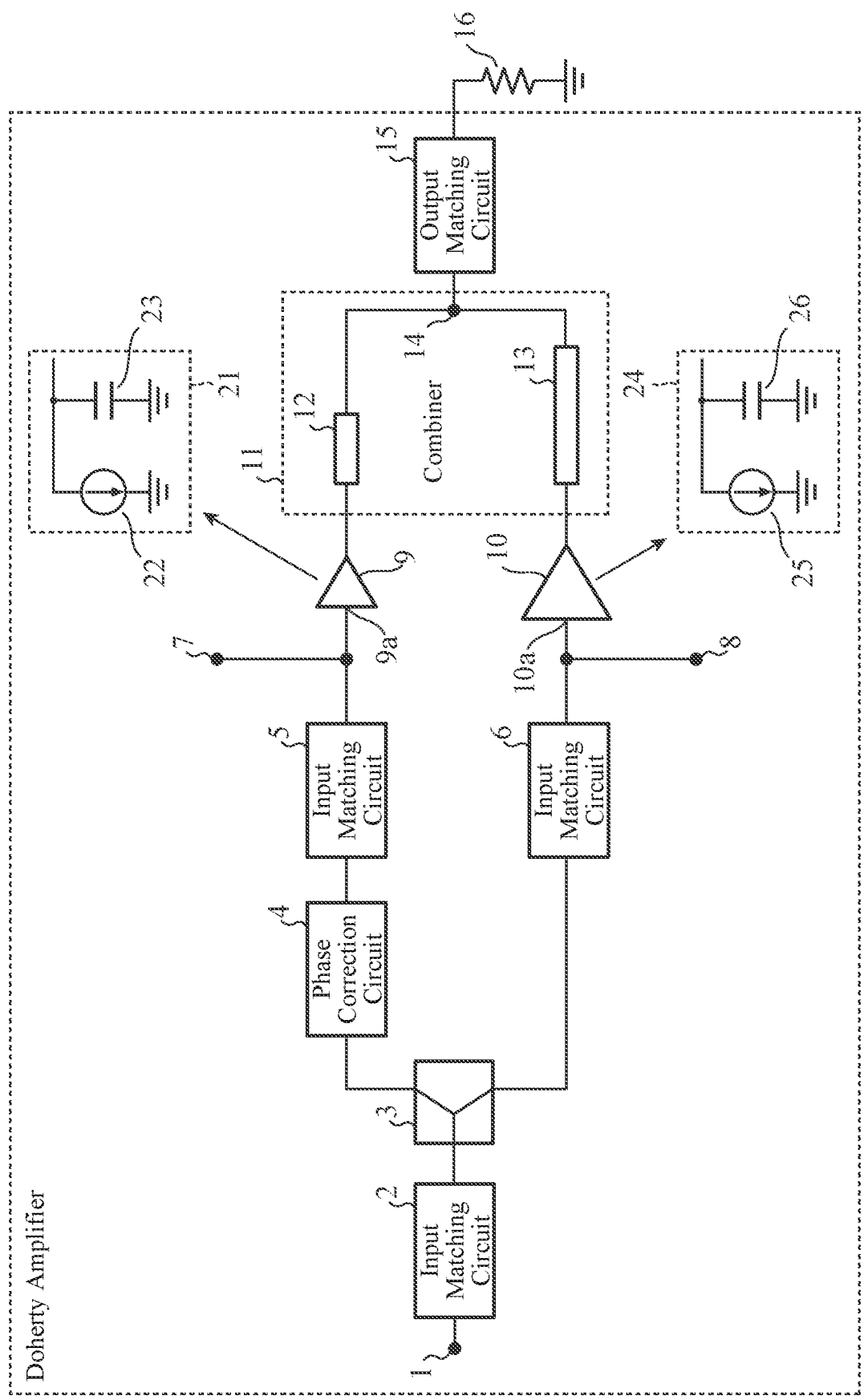
FIG. 1 is a configuration diagram illustrating a Doherty amplifier according to a first embodiment.

FIG. 1 is a configuration diagram illustrating a Doherty amplifier according to a first embodiment.

In FIG. 1, a signal to be amplified is provided to an input terminal 1.

An input matching circuit 2 is implemented by, for example, a circuit having a lumped component, a circuit having a distributed parameter line, a circuit in which a lumped component and a distributed parameter line are combined, a matching circuit in which an inductor and a capacitor are combined, or a quarter wavelength line.

A first end of the input matching circuit 2 is connected with the input terminal 1, and a second end of the input matching circuit 2 is connected with the input side of a divider 3.

The input matching circuit 2 performs impedance matching between the input terminal 1 and the divider 3.

The divider 3 is implemented by, for example, a Wilkinson divider or a hybrid circuit.

The divider 3 divides a signal to be amplified propagated through the input matching circuit 2 into two.

The divider 3 outputs one of the divided signals to a phase correction circuit 4 as a first signal.

The divider 3 outputs the other one of the divided signals to an input matching circuit 6 as a second signal.

A phase correction circuit 4 is implemented by, for example, a circuit having a lumped component, a circuit having a distributed parameter line, a circuit in which a lumped component and a distributed parameter line are combined, a matching circuit in which an inductor and a capacitor are combined, or a quarter wavelength line.

A first end of the phase correction circuit 4 is connected with a first output side of the divider 3, and a second end of the phase correction circuit 4 is connected with a first end of an input matching circuit 5.

The phase correction circuit 4 corrects the electrical length of a path passing through a first amplifier 9 in order to make the electrical length of the path passing through the first amplifier 9 and the electrical length of a path passing through a second amplifier 10 the same among in two paths from the divider 3 to an output combining point 14.

The input matching circuit 5 is implemented by, for example, a circuit having a lumped component, a circuit having a distributed parameter line, a circuit in which a lumped component and a distributed parameter line are combined, a matching circuit in which an inductor and a capacitor are combined, or a quarter wavelength line.

A first end of the input matching circuit 5 is connected with the second end of the phase correction circuit 4, and a second end of the input matching circuit 5 is connected with an input side of the first amplifier 9.

The input matching circuit 5 matches the input impedance of the first amplifier 9.

The input matching circuit 6 is implemented by, for example, a circuit having a lumped component, a circuit having a distributed parameter line, a circuit in which a lumped component and a distributed parameter line are combined, a matching circuit in which an inductor and a capacitor are combined, or a quarter wavelength line.

A first end of the input matching circuit 6 is connected with a second output side of the divider 3, and a second end of the input matching circuit 6 is connected with an input side of the second amplifier 10.

The input matching circuit 6 matches the input impedance of the second amplifier 10.

A bias voltage of the first amplifier 9 is applied to a bias terminal 7.

In a case where a frequency f of the first signal is a first frequency $f_1$, a bias voltage for biasing a gate terminal 9a, which is the input side of the first amplifier 9, to class C is provided to the bias terminal 7. The first frequency $f_1$ is, for example, a fundamental frequency. The bias voltage for biasing to class C is lower than a threshold voltage of the first amplifier 9.

In a case where the frequency f of the first signal is a second frequency $f_2$, a bias voltage for biasing the gate terminal 9a of the first amplifier 9 to class AB is provided to the bias terminal 7. The second frequency $f_2$ is, for example, twice the fundamental frequency. The bias voltage for biasing to class AB is a voltage equal to or higher than the threshold voltage of the first amplifier 9.

A bias voltage of the second amplifier 10 is applied to a bias terminal 8.

In a case where the frequency f of the second signal is the first frequency $f_1$, a bias voltage that biases the gate terminal 10a, which is the input side of the second amplifier 10, to class AB is provided to the bias terminal 8. The bias voltage for biasing to class AB is a voltage equal to or higher than a threshold voltage of the second amplifier 10.

In a case where the frequency f of the second signal is the second frequency $f_2$, a bias voltage for biasing the gate terminal 10a of the second amplifier 10 to class C is provided to the bias terminal 8. The bias voltage for biasing to class C is lower than the threshold voltage of the second amplifier 10.

The first amplifier 9 is implemented by, for example, a field effect transistor (FET), a heterojunction bipolar transistor (HBT), or a high electron mobility transistor (HEMT).

In a case where the frequency f of the first signal is the first frequency $f_1$, a bias voltage for biasing to class C is applied to the gate terminal 9a of the first amplifier 9.

In a case where the frequency f of the first signal is the second frequency $f_2$, a bias voltage for biasing to class AB is applied to the gate terminal 9a of the first amplifier 9.

In a case where the frequency f of the first signal is the first frequency $f_1$, the first amplifier 9 amplifies the first signal as an auxiliary amplifier when the first signal propagated through the input matching circuit 5 is at or above a first level.

In a case where the frequency f of the first signal is the second frequency $f_2$, the first amplifier 9 amplifies the first signal as the main amplifier regardless of the signal level of the first signal propagated through the input matching circuit 5.

A number "21" denotes an example of an output equivalent circuit of the first amplifier 9. The output equivalent circuit 21 of the first amplifier 9 is represented by a current source 22 and a capacitor 23.

The second amplifier 10 is implemented by, for example, an FET, an HBT, or a HEMT.

In a case where the frequency f of the second signal is the first frequency $f_1$, a bias voltage for biasing to class AB is applied to the gate terminal 10a of the second amplifier 10.

In a case where the frequency f of the second signal is the second frequency $f_2$, a bias voltage for biasing to class C is applied to the gate terminal 10a of the second amplifier 10.

A saturated output power $P_{S2}$ of the second amplifier 10 is larger than a saturated output power $P_{S1}$ of the first amplifier 9.

In a case where the frequency f of the second signal is the first frequency $f_1$, the second amplifier 10 amplifies the second signal as the main amplifier regardless of the signal level of the second signal propagated through the input matching circuit 6.

In a case where the frequency f of the second signal is the second frequency $f_2$, the second amplifier 10 amplifies the second signal as an auxiliary amplifier when the second signal propagated through the input matching circuit 6 is equal to or higher than a second level.

A number "24" denotes an example of an output equivalent circuit of the second amplifier 10. The output equivalent circuit 24 of the second amplifier 10 is represented by a current source 25 and a capacitor 26.

A combiner 11 includes a first output circuit 12 and a second output circuit 13.

The combiner 11 combines the first signal amplified by the first amplifier 9 and the second signal amplified by the second amplifier 10.

The combiner 11 outputs a combined signal of the first signal that has been amplified and the second signal that has been amplified to the output matching circuit 15.

When the first amplifier 9 amplifies the first signal as an auxiliary amplifier and the second amplifier 10 amplifies the second signal as the main amplifier, the combiner 11 transforms the output impedance of the second amplifier 10 so that the imaginary component in the output impedance of the second amplifier 10 is reduced.

That is, when the first amplifier 9 amplifies the first signal as an auxiliary amplifier and the second amplifier 10 amplifies the second signal as the main amplifier, the combiner 11 increases the output reflection coefficient of the second amplifier 10 by transforming the output impedance of the second amplifier 10. An increased amount of the output reflection coefficient is larger than a reduction amount of the output reflection coefficient of the second amplifier 10 accompanied by a difference ΔPs between the saturated output power $P_{S1}$ of the first amplifier 9 and the saturated output power $P_{S2}$ of the second amplifier 10.

When the first amplifier 9 amplifies the first signal as the main amplifier and the second amplifier 10 amplifies the second signal as an auxiliary amplifier, the combiner 11 transforms the output impedance of the first amplifier 9 so that the imaginary component in the output impedance of the first amplifier 9 is reduced.

That is, when the first amplifier 9 amplifies the first signal as the main amplifier and the second amplifier 10 amplifies the second signal as an auxiliary amplifier, the combiner 11 reduces the output reflection coefficient of the first amplifier 9 by transforming the output impedance of the first amplifier 9. The reduction amount of the output reflection coefficient is smaller than the increased amount of the output reflection coefficient of the first amplifier 9 accompanied by the difference ΔPs.

Figure 15:
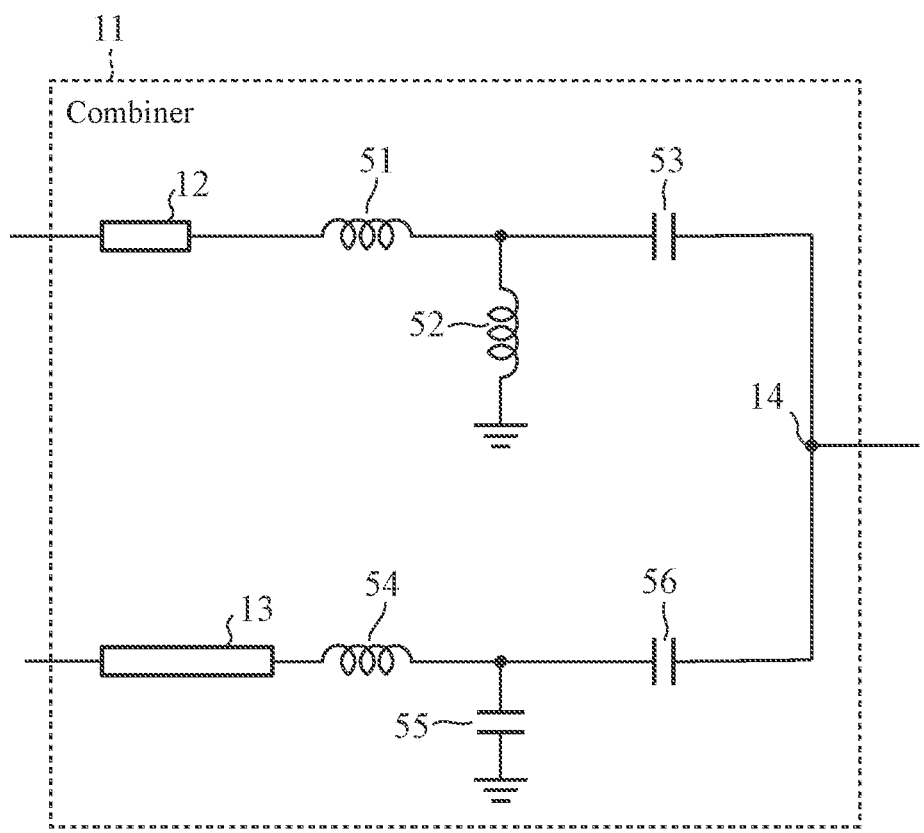
FIG. 15 is a configuration diagram illustrating an example of a combiner 11 including a lumped component.

In the Doherty amplifier illustrated in FIG. 1, the combiner 11 includes the first output circuit 12 and the second output circuit 13. However, this is merely an example, and the combiner 11 may include a lumped component in addition to the first output circuit 12 and the second output circuit 13 as illustrated in FIG. 15. As the lumped component, with respect to the first output circuit 12, a series inductor, a parallel inductor, a series capacitor, a parallel capacitor, a combination thereof, or the like is conceivable. Furthermore, with respect to the second output circuit 13, a series inductor, a parallel inductor, a series capacitor, a parallel capacitor, a combination thereof, or the like is conceivable.

FIG. 15 is a configuration diagram illustrating an example of a combiner 11 including a lumped component.

In the combiner 11 illustrated in FIG. 15, a series inductor 51, a parallel inductor 52, and a series capacitor 53 are provided for the first output circuit 12, and a series inductor 54, a parallel capacitor 55, and a series capacitor 56 are provided for the second output circuit 13.

A first end of the first output circuit 12 is connected with the output side of the first amplifier 9, and a second end of the first output circuit 12 is connected with the output combining point 14.

The first output circuit 12 transforms an output load to the first amplifier 9.

The first output circuit 12 has an electrical length shorter than 90 degrees in a case where the frequency f of the first signal is the first frequency $f_1$ and has an electrical length of 90 degrees in a case where the frequency f of the first signal is the second frequency $f_2$. In a case where the frequency f of the first signal is the second frequency $f_2$, the electrical length of the first output circuit 12 is not strictly limited to 90 degrees and may be deviated from 90 degrees as long as there is practically no problem.

A first end of the second output circuit 13 is connected with the output side of the second amplifier 10, and a second end of the second output circuit 13 is connected with the output combining point 14.

The second output circuit 13 transforms an output load to the second amplifier 10.

The second output circuit 13 has an electrical length greater than 90 degrees in a case where the frequency f of the second signal is the first frequency $f_1$ and has an electrical length of 180 degrees in a case where the frequency f of the second signal is the second frequency $f_2$. In a case where the frequency f of the second signal is the second frequency $f_2$, the electrical length of the second output circuit 13 is not strictly limited to 180 degrees and may be deviated from 180 degrees as long as there is practically no problem.

As the electrical lengths of the first output circuit 12 and the second output circuit 13, the following specific examples are presumed.

In a case where the frequency f of each of the first signal and the second signal is the first frequency $f_1$, the first output circuit 12 has an electrical length of 52.2 degrees, and the second output circuit 13 has an electrical length of 104.4 degrees.

In addition, in a case where the frequency f of each of the first signal and the second signal is the second frequency $f_2$, the first output circuit 12 has an electrical length of 90 degrees, and the second output circuit 13 has an electrical length of 180 degrees.

The output combining point 14 is a connection point between the second end of the first output circuit 12 and the second end of the second output circuit 13.

The output matching circuit 15 is implemented by, for example, a circuit having a lumped component, a circuit having a distributed parameter line, a circuit in which a lumped component and a distributed parameter line are combined, a matching circuit in which an inductor and a capacitor are combined, or a quarter wavelength line.

A first end of the output matching circuit 15 is connected with the output combining point 14, and a second end of the output matching circuit 15 is connected with a first end of the load 16.

The output matching circuit 15 matches the impedance of the output combining point 14 with the impedance of the load 16.

The load 16 is an external load of the Doherty amplifier.

The first end of the load 16 is connected with the second end of the output matching circuit 15, and the second end of the load 16 is grounded.

Next, the operation of the Doherty amplifier illustrated in FIG. 1 will be described.

First, the operation when the frequency f of each of the first signal and the second signal is the first frequency $f_1$ will be described. Here, it is based on the premise that the first frequency $f_1$ is a fundamental frequency.

In a case where the frequency f of the first signal is the first frequency $f_1$, a bias voltage for biasing the gate terminal 9a of the first amplifier 9 to class C is provided to the bias terminal 7, thereby causing the first amplifier 9 to operate as an auxiliary amplifier.

In a case where the frequency f of the second signal is the first frequency $f_1$, a bias voltage that biases the gate terminal 10a of the second amplifier 10 to class AB is provided to the bias terminal 8, thereby causing the second amplifier 10 to operate as the main amplifier.

A saturated output power $P_{S2}$ of the second amplifier 10 is larger than a saturated output power $P_{S1}$ of the first amplifier 9. That is, the size of the second amplifier 10 is larger than the size of the first amplifier 9.

Since the sizes of the first amplifier 9 and the second amplifier 10 are different, when the first amplifier 9 amplifies the first signal as an auxiliary amplifier and the second amplifier 10 amplifies the second signal as the main amplifier, the output reflection coefficient of the second amplifier 10 is reduced depending on the size ratio between the first amplifier 9 and the second amplifier 10. Furthermore, with reduction in the output reflection coefficient of the second amplifier 10, a back-off amount BF of the second amplifier 10 is reduced.

The combiner 11 increases the output reflection coefficient of the second amplifier 10 by transforming the output impedance of the second amplifier 10 in a case where the first amplifier 9 amplifies the first signal as an auxiliary amplifier and the second amplifier 10 amplifies the second signal as the main amplifier.

In the Doherty amplifier illustrated in FIG. 1, the electrical lengths in the first output circuit 12 and the second output circuit 13 are each designed so that the increased amount of the output reflection coefficient by the combiner 11 is larger than the reduction amount of the output reflection coefficient due to the size ratio between the first amplifier 9 and the second amplifier 10. If the combiner 11 includes a lumped component in addition to the first output circuit 12 and the second output circuit 13, the electrical length of each of the first output circuit 12 and the second output circuit 13 and the lumped component are designed so that the increased amount of the output reflection coefficient by the combiner 11 is larger than the reduction amount of the output reflection coefficient by the size ratio.

Therefore, in the Doherty amplifier illustrated in FIG. 1, in a case where the first amplifier 9 amplifies the first signal as an auxiliary amplifier and the second amplifier 10 amplifies the second signal as the main amplifier, the back-off amount BF of the second amplifier 10 is increased, and thus the efficiency during the back-off operation is improved.

Figure 2:
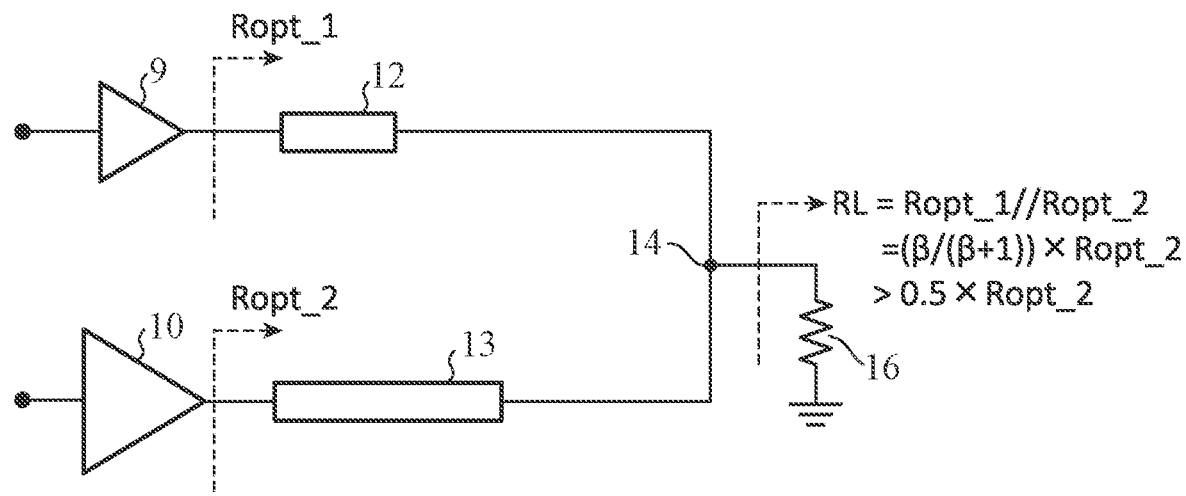
FIG. 2 is an explanatory diagram illustrating impedance in a case where a frequency f is a first frequency $f_1$ and output power of each of a first amplifier 9 and a second amplifier 10 is saturated output power.

FIG. 2 is an explanatory diagram illustrating impedance in a case where the frequency f is the first frequency $f_1$ and the output power of each of the first amplifier 9 and the second amplifier 10 is saturated output power.

In FIG. 2, the optimum load impedance of the first amplifier 9 in a case where the output power of the first amplifier 9 is the saturated output power $P_{S1}$ is denoted as Ropt_1, and the optimum load impedance of the second amplifier 10 in a case where the output power of the second amplifier 10 is the saturated output power $P_{S2}$ is denoted as Ropt_2.

Since the saturated output power $P_{S2}$ of the second amplifier 10 is larger than the saturated output power $P_{S1}$ of the first amplifier 9, if Ropt_1 is given by β×Ropt_2, β is a value larger than 1.

At this point, the impedance RL on the load 16 side as viewed from the output combining point 14 has a value obtained from the optimum load impedance Ropt_1 of the first amplifier 9 and the optimum load impedance Ropt_2 of the second amplifier 10 that are placed in parallel with each other, as expressed by the following Equation (1).

$$RL = \frac{\text{Ropt\_1}}{\text{Ropt\_1} + \text{Ropt\_2}} = \frac{\beta}{\beta + 1} \times \text{Ropt\_2} \quad (1)$$

Since β is a value larger than 1, the impedance RL on the load 16 side as viewed from the output combining point 14 is larger than 0.5 times the optimum load impedance Ropt_2 as illustrated in the following Equation (2).

$$RL > 0.5 \times \text{Ropt\_2} \quad (2)$$

Figure 3:
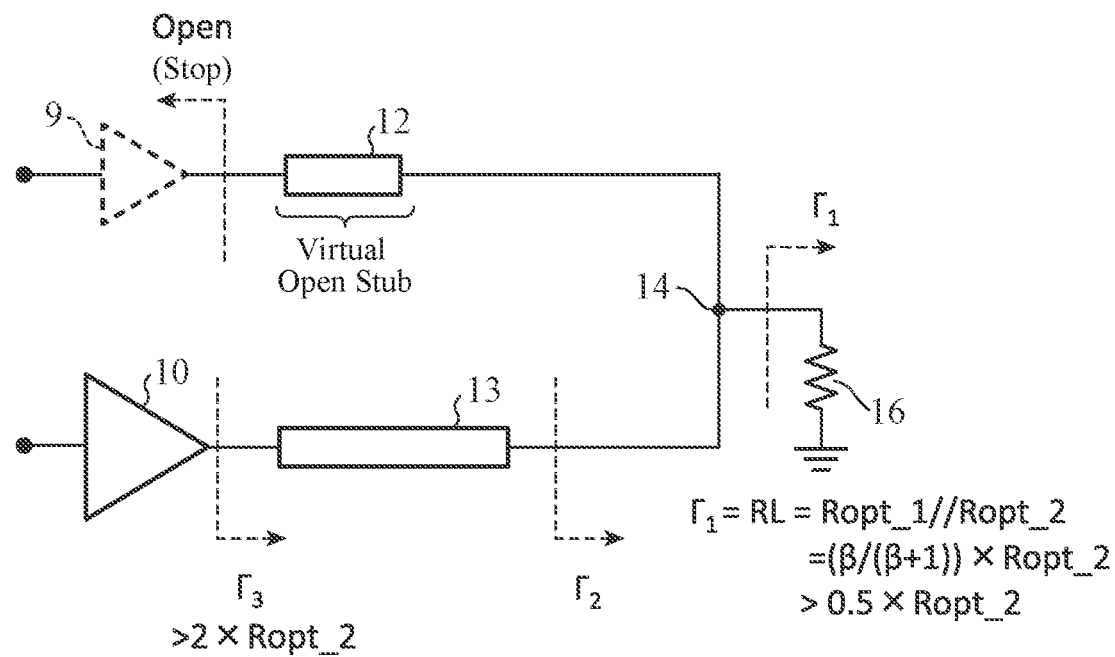
FIG. 3 is an explanatory diagram illustrating impedance in the back-off state in which the frequency f is the first frequency $f_1$ and the first amplifier 9 is stopped.

FIG. 3 is an explanatory diagram illustrating impedance in the back-off state in a case where the frequency f is the first frequency $f_1$ and the first amplifier 9 is stopped.

Figure 4:
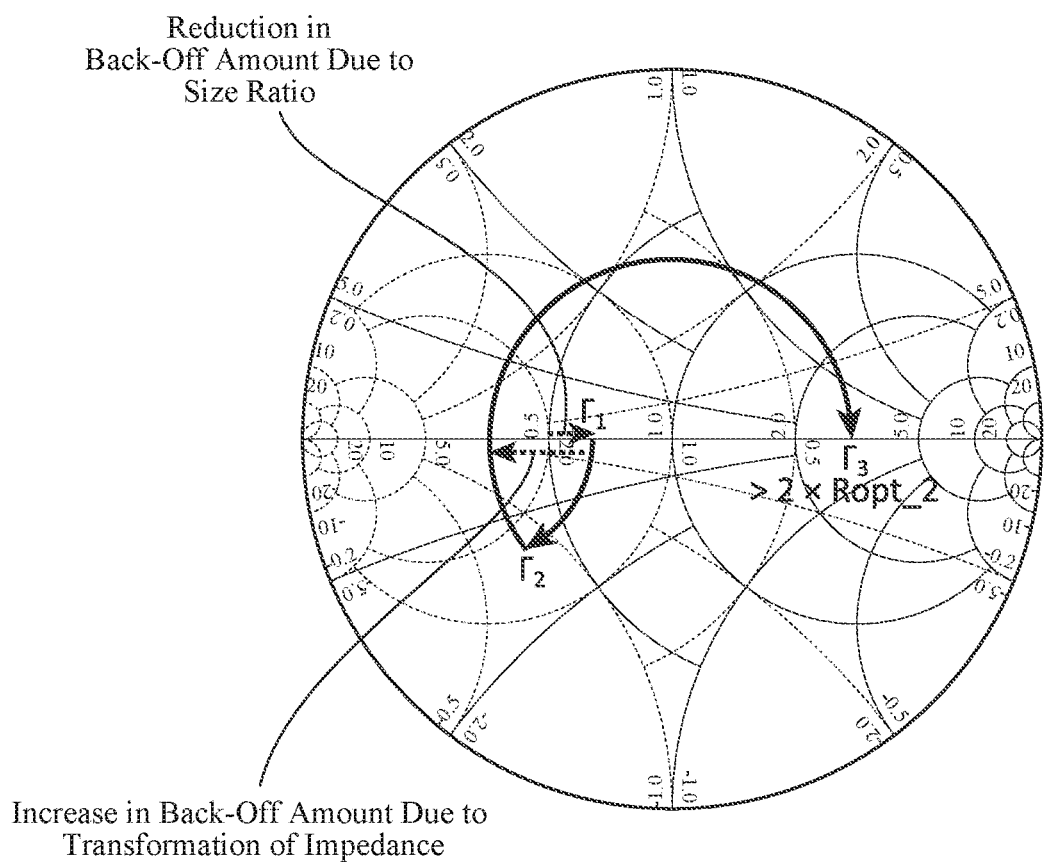
FIG. 4 is an explanatory diagram illustrating a back-off amount BF of the second amplifier 10.

FIG. 4 is an explanatory diagram illustrating the back-off amount BF of the second amplifier 10.

In a back-off state, the first amplifier 9 is stopped, and thus the output load of the output combining point 14 is occupied by the second amplifier 10. Therefore, the impedance $\Gamma_1$ (=RL) on the load 16 side as viewed from the output combining point 14 is larger than 0.5 times Ropt_2.

If the size of the first amplifier 9 is equal to the size of the second amplifier 10, the impedance $\Gamma_1$ is 0.5 times Ropt_2. In the Doherty amplifier illustrated in FIG. 1, the size of the second amplifier 10 is larger than the size of the first amplifier 9, the impedance $\Gamma_1$ is reduced as compared with a typical Doherty amplifier in which the size of a first amplifier 9 is equal to the size of a second amplifier 10. That is, the back-off amount BF is reduced.

In the back-off state, since the first amplifier 9 is stopped, the output impedance of the first amplifier 9 is open. Since the output impedance of the first amplifier 9 is open, looking at the first amplifier 9 from the output combining point 14, the first output circuit 12 functions as a virtual open stub.

Since the first output circuit 12 functions as an open stub, the impedance $\Gamma_1$ on the load 16 side as viewed from the output combining point 14 is transformed to the impedance $\Gamma_2$. With the impedance $\Gamma_1$ transformed to the impedance $\Gamma_2$, the back-off amount BF is increased as illustrated in FIG. 4. As illustrated in FIG. 4, the impedance $\Gamma_2$ has an imaginary component that is a reactance component.

In the Doherty amplifier illustrated in FIG. 1, the size of the second amplifier 10 is larger than the size of the first amplifier 9. Therefore, in the back-off state, as illustrated in FIG. 4, the back-off amount BF of the second amplifier 10 is reduced depending on the size ratio between the first amplifier 9 and the second amplifier 10.

In addition, in the Doherty amplifier illustrated in FIG. 1, the impedance $\Gamma_2$ is transformed to $\Gamma_3$ on the real axis by the second output circuit 13 as illustrated in FIG. 4. That is, the imaginary component of the impedance $\Gamma_2$ is reduced by the second output circuit 13.

In the Doherty amplifier illustrated in FIG. 1, the increased amount of the back-off amount BF by the combiner 11 is larger than the reduction amount of the back-off amount BF that is dependent on the size ratio between the first amplifier 9 and the second amplifier 10 as illustrated in FIG. 4.

The impedance $\Gamma_3$ is larger than impedance 2×Rout_2 of a typical Doherty amplifier having a back-off amount BF of 6 dB. Therefore, the Doherty amplifier illustrated in FIG. 1 can achieve a larger back-off amount BF than in a typical Doherty amplifier.

In addition, since the impedance $\Gamma_3$ is transformed on the real axis, the Doherty amplifier illustrated in FIG. 1 does not cause a decrease in efficiency due to the output impedance of the second amplifier 10 having an imaginary component.

Next, the operation when the frequency f of each of the first signal and the second signal is the second frequency $f_2$ will be described. Here, it is based on the premise that the second frequency $f_2$ is twice the fundamental frequency.

In a case where the frequency f of the first signal is the second frequency $f_2$, a bias voltage for biasing the gate terminal 9a of the first amplifier 9 to class AB is provided to the bias terminal 7, thereby causing the first amplifier 9 to operate as the main amplifier.

In a case where the frequency f of the second signal is the second frequency $f_2$, a bias voltage for biasing the gate terminal 10a of the second amplifier 10 to class C is provided to the bias terminal 8, thereby causing the second amplifier 10 to operate as an auxiliary amplifier.

Since the sizes of the first amplifier 9 and the second amplifier 10 are different, when the first amplifier 9 amplifies the first signal as the main amplifier and the second amplifier 10 amplifies the second signal as an auxiliary amplifier, the output reflection coefficient of the first amplifier 9 is increased depending on the size ratio between the first amplifier 9 and the second amplifier 10. In addition, with an increase in the output reflection coefficient of the first amplifier 9, the back-off amount BF of the first amplifier 9 is increased.

In a case where the first amplifier 9 amplifies the first signal as the main amplifier and the second amplifier 10 amplifies the second signal as an auxiliary amplifier, the combiner 11 reduces the output reflection coefficient of the first amplifier 9 by transforming the output impedance of the first amplifier 9.

In the Doherty amplifier illustrated in FIG. 1, the electrical lengths in the first output circuit 12 and the second output circuit 13 are each designed so that the reduction amount of the output reflection coefficient by the combiner 11 is smaller than the increased amount of the output reflection coefficient due to the size ratio between the first amplifier 9 and the second amplifier 10. If the combiner 11 includes a lumped component in addition to the first output circuit 12 and the second output circuit 13, the electrical length of each of the first output circuit 12 and the second output circuit 13 and the lumped component are designed so that the reduction amount of the output reflection coefficient by the combiner 11 is larger than the increased amount of the output reflection coefficient by the size ratio.

Therefore, in the Doherty amplifier illustrated in FIG. 1, in a case where the first amplifier 9 amplifies the first signal as the main amplifier and the second amplifier 10 amplifies the second signal as an auxiliary amplifier, the back-off amount BF of the first amplifier 9 is increased, and thus the efficiency during the back-off operation is improved.

Figure 5:
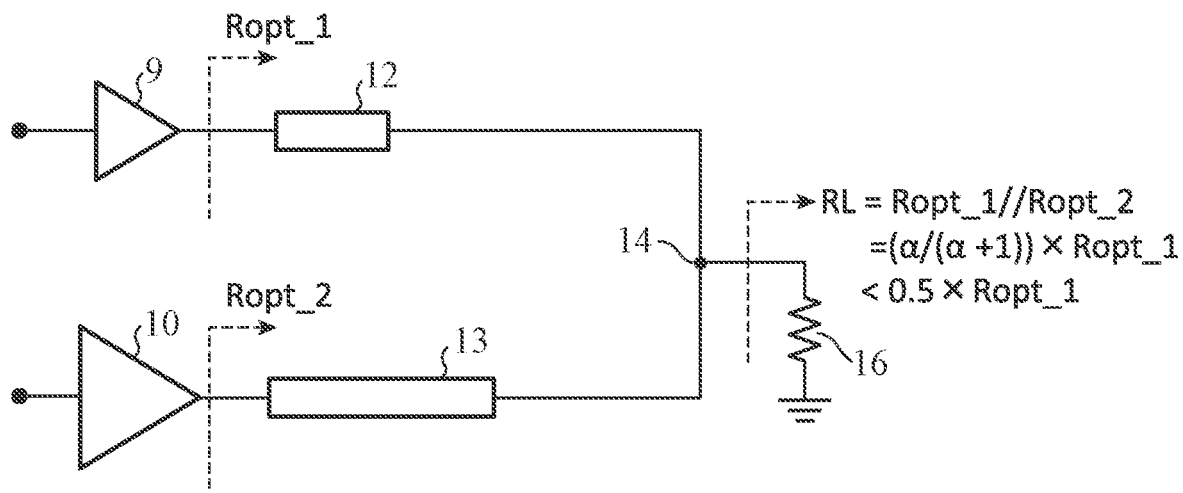
FIG. 5 is an explanatory diagram illustrating impedance in a case where the frequency f is a second frequency $f_2$ and output power of each of the first amplifier 9 and the second amplifier 10 is saturated output power.

FIG. 5 is an explanatory diagram illustrating impedance in a case where the frequency f is the second frequency $f_2$ and the output power of each of the first amplifier 9 and the second amplifier 10 is saturated output power.

In FIG. 5, the optimum load impedance of the first amplifier 9 when the output power of the first amplifier 9 is the saturated output power $P_{S1}$ is Ropt_1, and the optimum load impedance of the second amplifier 10 when the output power of the second amplifier 10 is the saturated output power $P_{S2}$ is Ropt_2.

Since the saturated output power $P_{S2}$ of the second amplifier 10 is larger than the saturated output power $P_{S1}$ of the first amplifier 9, if Ropt_2 is given by α×Ropt_1, α is a value smaller than 1.

At this point, the impedance RL on the load 16 side as viewed from the output combining point 14 has a value obtained from the optimum load impedance Ropt_1 of the first amplifier 9 and the optimum load impedance Ropt_2 of the second amplifier 10 are placed in parallel with each other, as expressed by the following Equation (3).

$$RL = \frac{\text{Ropt\_2}}{\text{Ropt\_1} + \text{Ropt\_2}} = \frac{\alpha}{\alpha + 1} \times \text{Ropt\_1} \qquad (3)$$

Since α is a value smaller than 1, the impedance RL on the load 16 side as viewed from the output combining point 14 is smaller than 0.5 times the optimum load impedance Ropt_1, as illustrated in the following Inequation (4).

$$RL < 0.5 \times \text{Ropt\_1} \qquad (4)$$

Figure 6:
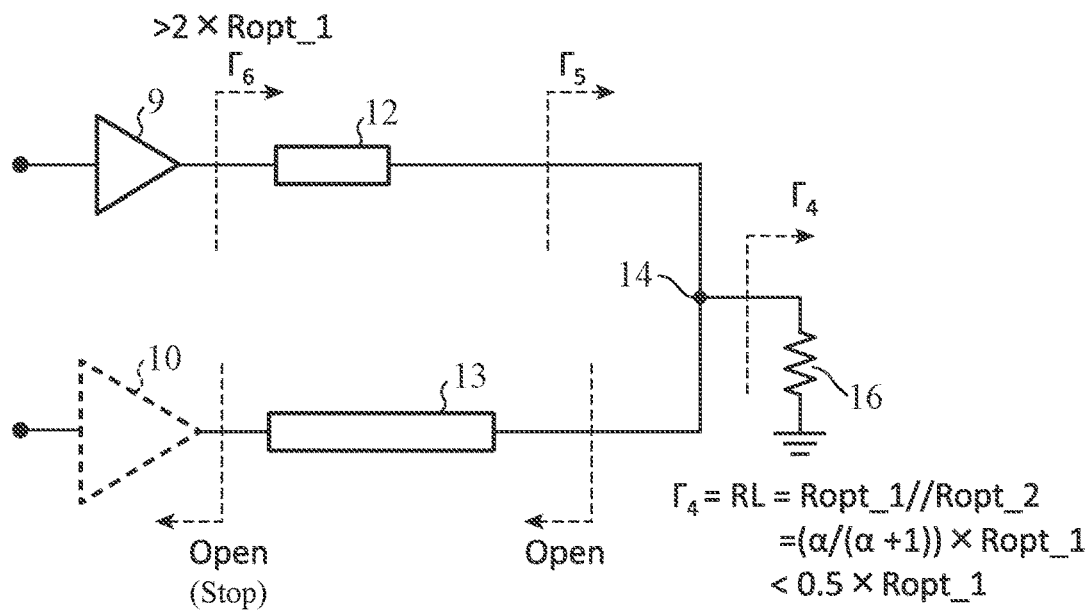
FIG. 6 is an explanatory diagram illustrating impedance in the back-off state in which the frequency f is the second frequency $f_2$ and the second amplifier 10 is stopped.

FIG. 6 is an explanatory diagram illustrating impedance in the back-off state in a case where the frequency f is the second frequency $f_2$ and the second amplifier 10 is stopped.

Figure 7:
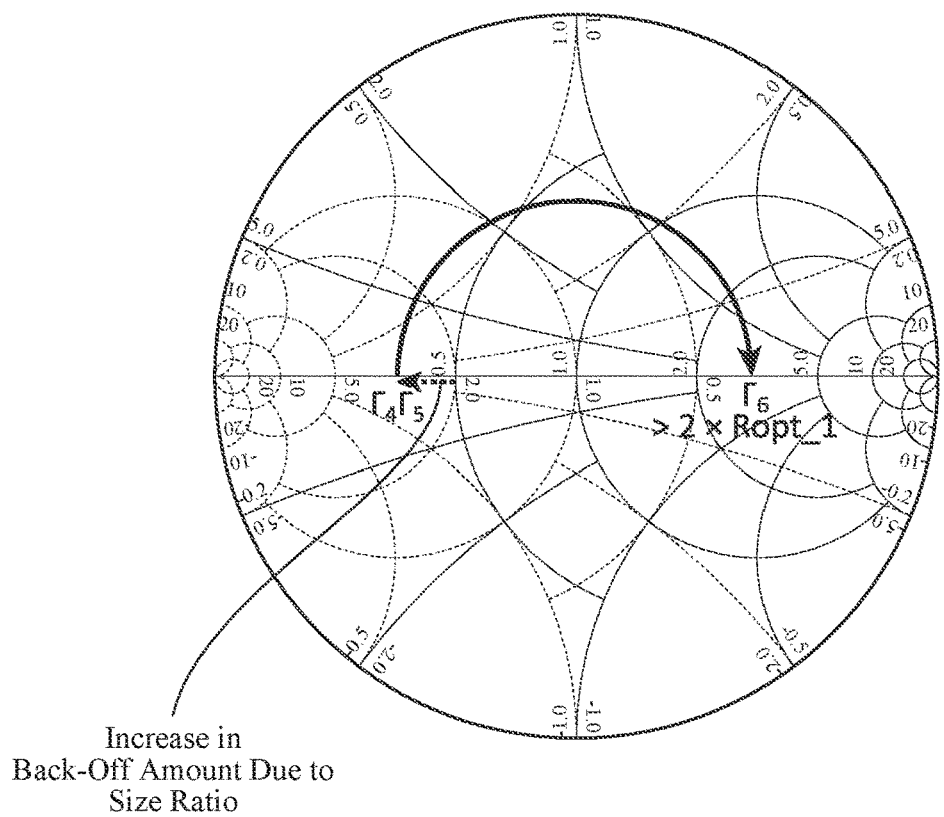
FIG. 7 is an explanatory diagram illustrating a back-off amount BF of the first amplifier 9.

FIG. 7 is an explanatory diagram illustrating the back-off amount BF of the first amplifier 9.

In the back-off state, the second amplifier 10 is stopped, and thus the output load of the output combining point 14 is occupied by the first amplifier 9. Therefore, the impedance $\Gamma_4$ (=RL) on the load 16 side as viewed from the output combining point 14 is smaller than 0.5 times Ropt_1.

If the size of the first amplifier 9 is equal to the size of the second amplifier 10, the impedance $\Gamma_4$ is 0.5 times Ropt_1. In the Doherty amplifier illustrated in FIG. 1, the size of the second amplifier 10 is larger than the size of the first amplifier 9, the impedance $\Gamma_4$ is increased as compared with a typical Doherty amplifier in which the size of a first amplifier 9 is equal to the size of a second amplifier 10. That is, the back-off amount BF is increased.

In the back-off state, the second amplifier 10 is stopped, and thus the output impedance of the second amplifier 10 is open. The electrical length of the second output circuit 13 is 180 degrees. Therefore, the impedance $\Gamma_4$ is not transformed by the second output circuit 13.

Since the impedance $\Gamma_4$ is not transformed by the second output circuit 13, the impedance $\Gamma_5$ on the output combining point 14 side as viewed from the first output circuit 12 is the same as the impedance Lt, and the back-off amount BF does not change.

Here, since the electrical length of the second output circuit 13 is 180 degrees, the impedance $\Gamma_4$ is not transformed by the second output circuit 13, and the back-off amount BF does not change. However, this is merely an example, and the second output circuit 13 may include, for example, a lumped component to transform the impedance $\Gamma_4$ so that the back-off amount BF is reduced.

In the Doherty amplifier illustrated in FIG. 1, the size of the second amplifier 10 is larger than the size of the first amplifier 9. Therefore, in the back-off state, as illustrated in FIG. 7, the back-off amount BF of the first amplifier 9 is increased depending on the size ratio between the first amplifier 9 and the second amplifier 10.

In addition, in the Doherty amplifier illustrated in FIG. 1, the impedance $\Gamma_5$ is transformed to $\Gamma_6$ on the real axis by the first output circuit 12 as illustrated in FIG. 7.

In the Doherty amplifier illustrated in FIG. 1, the reduction amount of the back-off amount BF by the combiner 11 is smaller than the increased amount of the back-off amount BF that is dependent on the size ratio between the first amplifier 9 and the second amplifier 10 as illustrated in FIG. 7.

The impedance $\Gamma_6$ is larger than the impedance 2×Rout_2 of the typical Doherty amplifier having a back-off amount BF of 6 dB. Therefore, the Doherty amplifier illustrated in FIG. 1 can achieve a larger back-off amount BF than in a typical Doherty amplifier.

In addition, since the impedance $\Gamma_6$ is transformed on the real axis, the Doherty amplifier illustrated in FIG. 1 does not cause a decrease in efficiency due to the output impedance of the first amplifier 9 having an imaginary component.

In the first embodiment described above, the Doherty amplifier includes: the first amplifier 9 that amplifies the first signal as an auxiliary amplifier in a case where the frequency of each of the first signal and the second signal is the first frequency and amplifies the first signal as the main amplifier in a case where the frequency of each of the first signal and the second signal is the second frequency; the second amplifier 10 that amplifies the second signal as the main amplifier in a case where the frequency of each of the first signal and the second signal is the first frequency and amplifies the second signal as an auxiliary amplifier in a case where the frequency of each of the first signal and the second signal is the second frequency; and the combiner 11 that synthesizes the first signal amplified by the first amplifier 9 and the second signal amplified by the second amplifier 10. In addition, the second amplifier 10 has a saturated output power larger than that of the first amplifier 9, and the combiner 11 transforms the output impedance of the first amplifier 9 so that the imaginary component in the output impedance of the first amplifier 9 is reduced in a case where the first amplifier 9 amplifies the first signal as the main amplifier and the second amplifier 10 amplifies the second signal as an auxiliary amplifier. Therefore, the Doherty amplifier can suppress a decrease in efficiency during the back-off operation in a case where the frequency of a signal is the second frequency.

Second Embodiment

In a second embodiment, a Doherty amplifier will be described in which a first amplifier 9 amplifies a first signal as an auxiliary amplifier, and a second amplifier 10 amplifies a second signal as the main amplifier in a case where the frequency f of each of the first signal and the second signal is a third frequency $f_3$.

The configuration of the Doherty amplifier according to the second embodiment is similar to the configuration of the Doherty amplifier according to the first embodiment, and a configuration diagram illustrating the Doherty amplifier according to the second embodiment is illustrated in FIG. 1.

However, in the Doherty amplifier according to the second embodiment, the first output circuit 12 has an electrical length shorter than 90 degrees in a case where the frequency f of the first signal is the first frequency $f_1$ and has an electrical length of 90 degrees in a case where the frequency f of the first signal is the second frequency $f_2$. In addition, the first output circuit 12 has an electrical length greater than or equal to 90 degrees in a case where the frequency f of the first signal is the third frequency $f_3$.

The second output circuit 13 has an electrical length greater than 90 degrees in a case where the frequency f of the second signal is the first frequency $f_1$ and has an electrical length of 180 degrees in a case where the frequency f of the second signal is the second frequency $f_2$. In addition, in a case where the frequency f of the second signal is the third frequency $f_3$, the second output circuit 13 has an electrical length shorter than 270 degrees.

The operation when the frequency f of each of the first signal and the second signal is the third frequency $f_3$ will be described. Here, it is based on the premise that the third frequency $f_3$ is a triple frequency of the fundamental frequency.

In a case where the frequency f of the first signal is the third frequency $f_3$, a bias voltage for biasing the gate terminal 9a of the first amplifier 9 to class C is provided to the bias terminal 7, thereby causing the first amplifier 9 to operate as an auxiliary amplifier.

In a case where the frequency f of the second signal is the third frequency $f_3$, a bias voltage for biasing the gate terminal 10a of the second amplifier 10 to class AB is provided to the bias terminal 8, thereby causing the second amplifier 10 to operate as the main amplifier.

A saturated output power $P_{S2}$ of the second amplifier 10 is larger than a saturated output power $P_{S1}$ of the first amplifier 9. That is, the size of the second amplifier 10 is larger than the size of the first amplifier 9.

Since the sizes of the first amplifier 9 and the second amplifier 10 are different, when the first amplifier 9 amplifies the first signal as an auxiliary amplifier and the second amplifier 10 amplifies the second signal as the main amplifier, the output reflection coefficient of the second amplifier 10 is reduced depending on the size ratio between the first amplifier 9 and the second amplifier 10. Furthermore, with reduction in the output reflection coefficient of the second amplifier 10, a back-off amount BF of the second amplifier 10 is reduced.

The combiner 11 increases the output reflection coefficient of the second amplifier 10 by transforming the output impedance of the second amplifier 10 in a case where the first amplifier 9 amplifies the first signal as an auxiliary amplifier and the second amplifier 10 amplifies the second signal as the main amplifier.

In the Doherty amplifier according to the second embodiment, the electrical lengths in the first output circuit 12 and the second output circuit 13 are each designed so that the increased amount of the output reflection coefficient by the combiner 11 is larger than the reduction amount of the output reflection coefficient due to the size ratio between the first amplifier 9 and the second amplifier 10. If the combiner 11 includes a lumped component in addition to the first output circuit 12 and the second output circuit 13, the electrical length of each of the first output circuit 12 and the second output circuit 13 and the lumped component are designed so that the increased amount of the output reflection coefficient by the combiner 11 is larger than the reduction amount of the output reflection coefficient by the size ratio.

Therefore, in the Doherty amplifier according to the second embodiment, in a case where the first amplifier 9 amplifies the first signal as an auxiliary amplifier and the second amplifier 10 amplifies the second signal as the main amplifier, the back-off amount BF of the second amplifier 10 is increased, and thus the efficiency during the back-off operation is improved.

Similarly to the impedance in a case where the frequency f is the first frequency $f_1$, the impedance in a case where the frequency f is the third frequency $f_3$ and the output power of each of the first amplifier 9 and the second amplifier 10 is the saturated output power is illustrated in FIG. 2.

Figure 8:
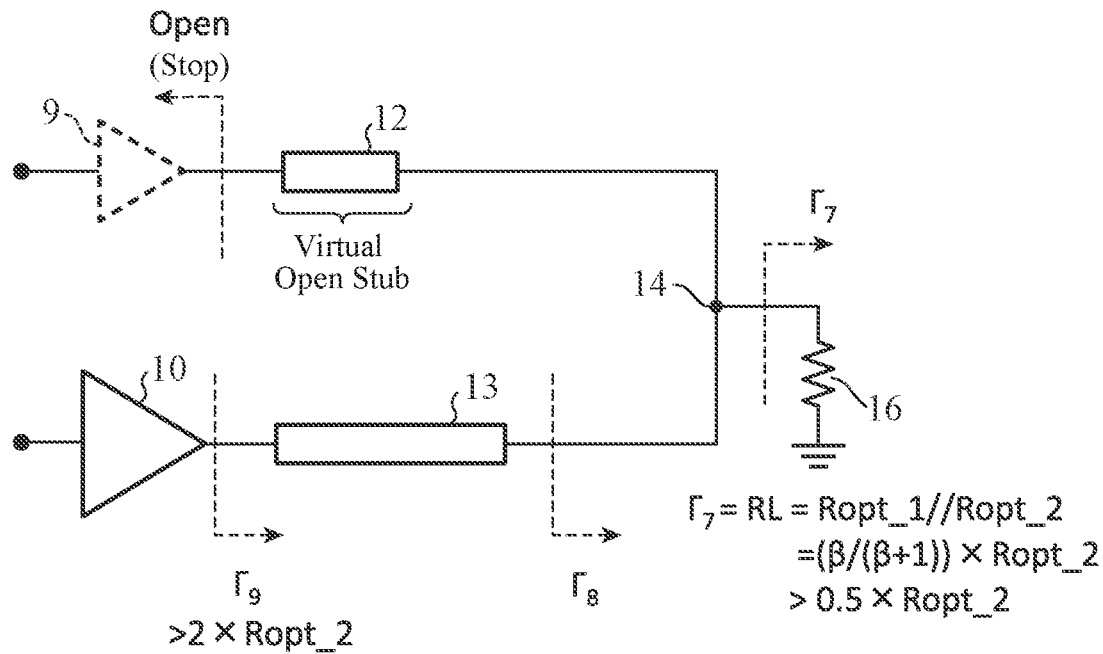
FIG. 8 is an explanatory diagram illustrating impedance in the back-off state in which the frequency f is a third frequency $f_3$ and the first amplifier 9 is stopped.

FIG. 8 is an explanatory diagram illustrating impedance in the back-off state in a case where the frequency f is the third frequency $f_3$ and the first amplifier 9 is stopped.

Figure 9:
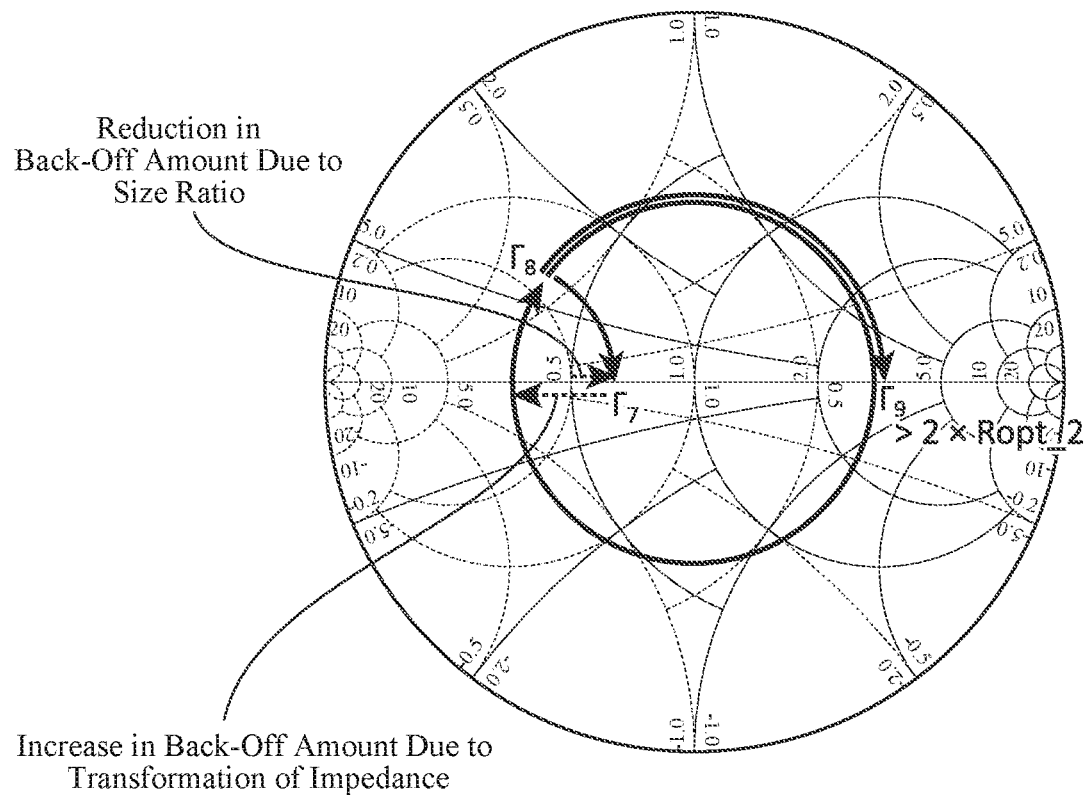
FIG. 9 is an explanatory diagram illustrating a back-off amount BF of the second amplifier 10.

FIG. 9 is an explanatory diagram illustrating the back-off amount BF of the second amplifier 10.

In a back-off state, the first amplifier 9 is stopped, and thus the output load of the output combining point 14 is occupied by the second amplifier 10. Therefore, the impedance $\Gamma_7$ (=RL) on the load 16 side as viewed from the output combining point 14 is larger than 0.5 times Ropt_2.

If the size of the first amplifier 9 is equal to the size of the second amplifier 10, the impedance $\Gamma_7$ is 0.5 times Ropt_2. In the Doherty amplifier according to the second embodiment, since the size of the second amplifier 10 is larger than the size of the first amplifier 9, the impedance $\Gamma_7$ is reduced as compared with a typical Doherty amplifier in which the size of a first amplifier 9 is equal to the size of a second amplifier 10. That is, the back-off amount BF is reduced.

In the back-off state, since the first amplifier 9 is stopped, the output impedance of the first amplifier 9 is open. Since the output impedance of the first amplifier 9 is open, looking at the first amplifier 9 from the output combining point 14, the first output circuit 12 functions as a virtual open stub.

Since the first output circuit 12 functions as an open stub, the impedance $\Gamma_7$ on the load 16 side as viewed from the output combining point 14 is transformed to the impedance $\Gamma_8$. With the impedance $\Gamma_7$ transformed to the impedance $\Gamma_8$, the back-off amount BF is increased as illustrated in FIG. 9. As illustrated in FIG. 9, the impedance $\Gamma_8$ has an imaginary component that is a reactance component.

In the Doherty amplifier according to the second embodiment, the size of the second amplifier 10 is larger than the size of the first amplifier 9. Therefore, in the back-off state, the back-off amount BF of the second amplifier 10 is reduced depending on the size ratio between the first amplifier 9 and the second amplifier 10.

In addition, in the Doherty amplifier according to the second embodiment, the impedance $\Gamma_8$ is transformed to $\Gamma_9$ on the real axis by the second output circuit 13 as illustrated in FIG. 9. That is, the imaginary component of the impedance $\Gamma_8$ is reduced by the second output circuit 13.

In the Doherty amplifier according to the second embodiment, the increased amount of the back-off amount BF by the combiner 11 is larger than the reduction amount of the back-off amount BF that is dependent on the size ratio between the first amplifier 9 and the second amplifier 10 as illustrated in FIG. 9.

The impedance $\Gamma_9$ is larger than the impedance 2×Rout_2 of the typical Doherty amplifier having a back-off amount BF of 6 dB. Therefore, the Doherty amplifier according to the second embodiment can achieve a larger back-off amount BF than in a typical Doherty amplifier.

In addition, since the impedance $\Gamma_9$ is transformed on the real axis, the Doherty amplifier according to the second embodiment does not cause a decrease in efficiency due to the output impedance of the second amplifier 10 having the imaginary component.

Figure 10:
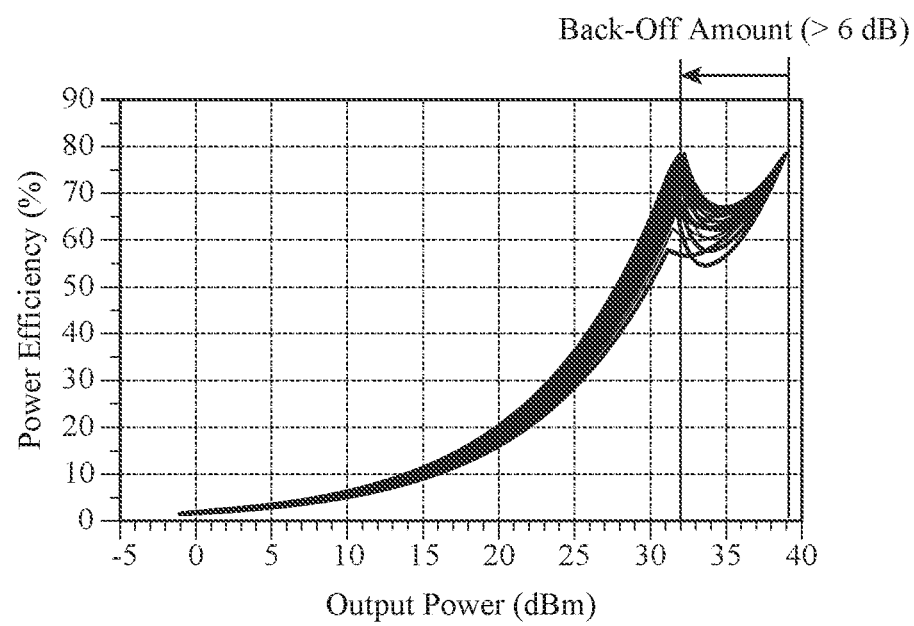
FIG. 10 is an explanatory graph illustrating a simulation result of power efficiency corresponding to output power of the Doherty amplifier.

FIG. 10 is an explanatory graph illustrating a simulation result of power efficiency corresponding to output power of the Doherty amplifier.

In FIG. 10, the horizontal axis represents the output power (dBm) of the Doherty amplifier according to the second embodiment, and the vertical axis represents the power efficiency (%) of the Doherty amplifier according to the second embodiment.

Figure 11:
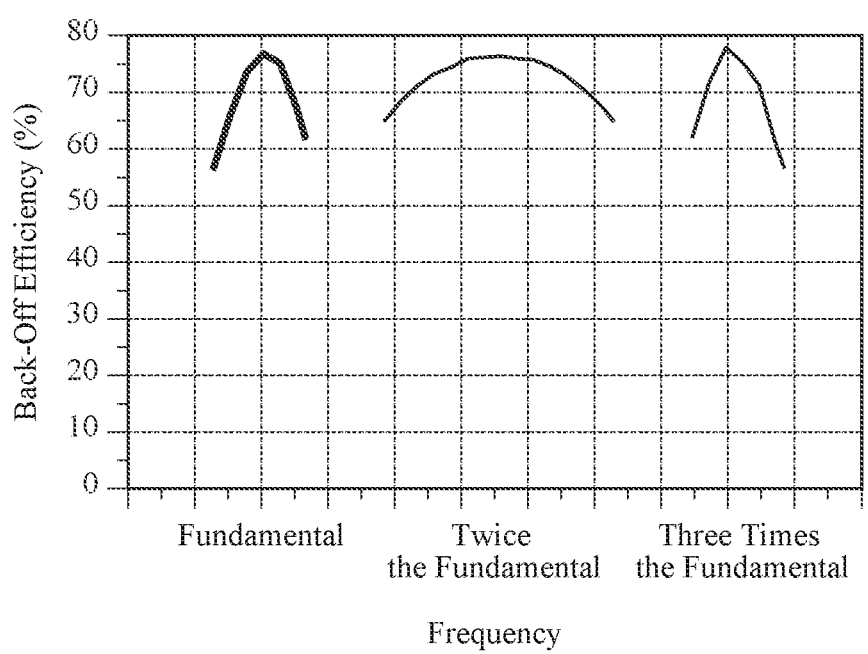
FIG. 11 is an explanatory diagram illustrating simulation results of back-off efficiency corresponding to the frequency f of each of a first signal and a second signal.

FIG. 11 is an explanatory graph illustrating simulation results of back-off efficiency corresponding to the frequency f of each of the first signal and the second signal.

In FIG. 11, the horizontal axis represents the frequency f of each of the first signal and the second signal, and the vertical axis represents the back-off efficiency (%) of the Doherty amplifier according to the second embodiment.

As illustrated in FIG. 10, the Doherty amplifier according to the second embodiment can achieve a back-off amount larger than 6 dB.

As illustrated in FIG. 11, the Doherty amplifier according to the second embodiment can achieve high back-off efficiency not only in a case where the frequency f is the first frequency $f_1$ that is the fundamental frequency, but also in a case where the frequency f is the second frequency $f_2$ that is twice the fundamental frequency and the third frequency $f_3$ that is three times the fundamental frequency.

In the second embodiment described above, the Doherty amplifier is configured so that the first amplifier 9 amplifies the first signal as an auxiliary amplifier in a case where the frequency of each of the first signal and the second signal is the third frequency and that the second amplifier 10 amplifies the second signal as the main amplifier. Furthermore, the combiner 11 transforms the output impedance of the second amplifier 10 so that the imaginary component in the output impedance of the second amplifier 10 is reduced in a case where the frequency of each of the first signal and the second signal is the third frequency, the first amplifier 9 amplifies the first signal as an auxiliary amplifier, and the second amplifier 10 amplifies the second signal as the main amplifier. Therefore, the Doherty amplifier can suppress a decrease in efficiency during the back-off operation in a case where the frequency of a signal is the third frequency.

Third Embodiment

In a third embodiment, a Doherty amplifier will be described in which a signal source of a first signal provided to a first amplifier 33 and a signal source of a second signal provided to a second amplifier 34 are separate signal sources.

Figure 12:
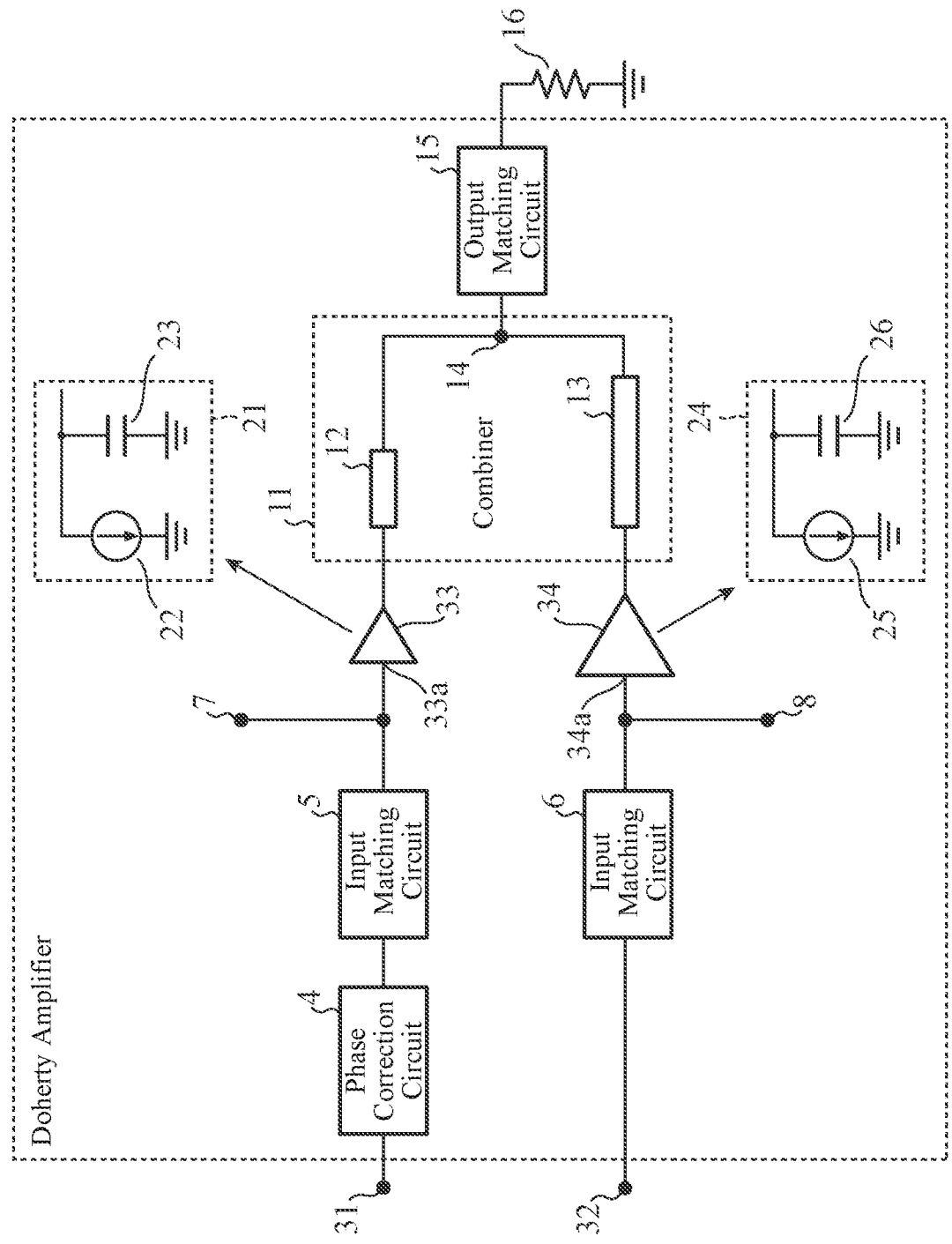
FIG. 12 is a configuration diagram illustrating a Doherty amplifier according to a third embodiment.

FIG. 12 is a configuration diagram illustrating a Doherty amplifier according to the third embodiment. In FIG. 12, the same symbol as that in FIG. 1 represents the same or a corresponding part, and thus description thereof is omitted.

The first signal is provided to an input terminal 31 from the first signal source (not illustrated) provided outside the Doherty amplifier.

The second signal is provided to an input terminal 32 from a second signal source (not illustrated) provided outside the Doherty amplifier. The first signal source and the second signal source are separate signal sources.

The first amplifier 33 is implemented by, for example, an FET, an HBT, or a HEMT.

A bias voltage for biasing to class B is applied to a gate terminal 33a of the first amplifier 33. That is, a bias voltage having substantially the same magnitude as a threshold voltage of the first amplifier 33 is applied to the gate terminal 33a of the first amplifier 9.

The first amplifier 33 amplifies the first signal as an auxiliary amplifier in a case where the frequency f of the first signal is the first frequency $f_1$ and the power of the first signal is smaller than the power of the second signal.

The first amplifier 33 amplifies the first signal as the main amplifier in a case where the frequency f of the first signal is the second frequency $f_2$ and the power of the first signal is greater than the power of the second signal.

The output equivalent circuit of the first amplifier 33 is the output equivalent circuit 21 similarly to the first amplifier 9 illustrated in FIG. 1.

The second amplifier 34 is implemented by, for example, an FET, an HBT, or a HEMT.

A bias voltage for biasing to class B is applied to a gate terminal 34a of the second amplifier 34. That is, a bias voltage having substantially the same magnitude as a threshold voltage of the second amplifier 34 is applied to the gate terminal 34a of the second amplifier 34.

The second amplifier 34 amplifies the second signal as the main amplifier in a case where the frequency f of the second signal is the first frequency $f_1$ and the power of the second signal is greater than the power of the first signal.

The second amplifier 34 amplifies the second signal as an auxiliary amplifier in a case where the frequency f of the second signal is the second frequency $f_2$ and the power of the second signal is smaller than the power of the first signal.

The output equivalent circuit of the second amplifier 34 is the output equivalent circuit 24 similarly to the second amplifier 10 illustrated in FIG. 1.

Next, the operation of the Doherty amplifier illustrated in FIG. 12 will be described.

In the Doherty amplifier illustrated in FIG. 12, in a case where the first signal having the first frequency $f_1$ is provided from the first signal source to the input terminal 31, the second signal having the first frequency $f_1$ is provided from the second signal source to the input terminal 32. At this point, the power of the first signal is smaller than the power of the second signal.

Furthermore, in a case where the first signal having the second frequency $f_2$ is provided from the first signal source to the input terminal 31, the second signal having the second frequency $f_2$ is provided from the second signal source to the input terminal 32. At this point, the power of the first signal is greater than the power of the second signal.

Therefore, in a case where the first signal having the first frequency $f_1$ is provided to the input terminal 31, the first amplifier 33 amplifies the first signal as an auxiliary amplifier. In a case where the first signal having the second frequency $f_2$ is provided to the input terminal 31, the first amplifier 33 amplifies the first signal as the main amplifier.

In a case where the second signal having the first frequency $f_1$ is provided to the input terminal 32, the second amplifier 34 amplifies the second signal as the main amplifier. In a case where the second signal of the second frequency $f_2$ is provided to the input terminal 32, the second amplifier 34 amplifies the second signal as an auxiliary amplifier.

As described above, even in a case where the signal source of the first signal provided to the first amplifier 33 and the signal source of the second signal provided to the second amplifier 34 are separate signal sources, the first amplifier 33 operates similarly to the first amplifier 9 illustrated in FIG. 1, and the second amplifier 34 operates similarly to the second amplifier 10 illustrated in FIG. 1.

A combiner 11 illustrated in FIG. 12 operates similarly to the combiner 11 illustrated in FIG. 1.

Therefore, the Doherty amplifier illustrated in FIG. 12 can suppress a decrease in efficiency during the back-off operation in a case where the frequency of a signal is the second frequency, similarly to the Doherty amplifier illustrated in FIG. 1.

In addition, it is possible to suppress a decrease in efficiency during back-off operation in a case where the frequency of a signal is the third frequency.

Fourth Embodiment

In a fourth embodiment, a Doherty amplifier connected with a transmission line 41 having an electrical length of an integral multiple of 180 degrees at each frequency f of a first signal and a second signal will be described.

Figure 13:
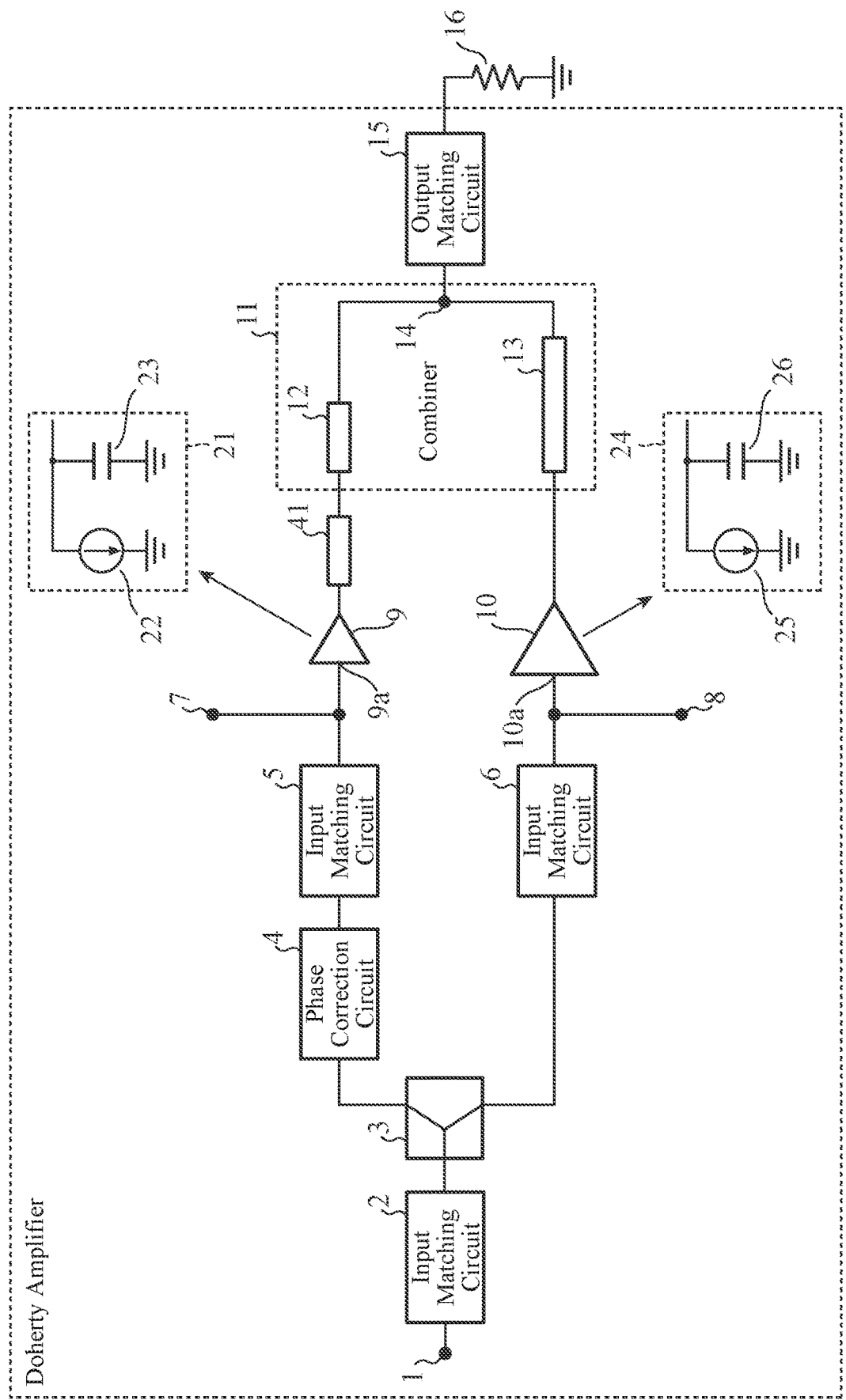
FIG. 13 is a configuration diagram illustrating a Doherty amplifier according to a fourth embodiment.

FIG. 13 is a configuration diagram illustrating the Doherty amplifier according to the fourth embodiment. In FIG. 13, the same symbol as that in FIG. 1 represents the same or a corresponding part, and thus description thereof is omitted.

A first end of the transmission line 41 is connected with the output side of a first amplifier.

A second end of the transmission line 41 is connected with a first end of a first output circuit 12 in a combiner 11.

The electrical length of the transmission line 41 is an integral multiple of 180 degrees at the frequency f of each of the first signal and the second signal.

In the Doherty amplifier illustrated in FIG. 13, the transmission line 41 is applied to the Doherty amplifier illustrated in FIG. 1. However, this is merely an example, and the transmission line 41 may be applied to the Doherty amplifier illustrated in FIG. 12.

The impedance at the first end of the transmission line 41 whose electrical length is an integral multiple of 180 degrees and the impedance at the second end of the transmission line 41 are the same impedance.

Therefore, even in a case where the transmission line 41 is connected between the output side of the first amplifier 9 and the combiner 11, the operation is similar to that of the Doherty amplifier illustrated in FIG. 1.

In the Doherty amplifier illustrated in FIG. 13, the transmission line 41 is connected between the output side of the first amplifier 9 and the combiner 11. However, this is merely an example, and as illustrated in FIG. 14, a transmission line 42 having an electrical length of an integral multiple of 180 degrees at each frequency f of a first signal and a second signal may be connected between the output side of the second amplifier 10 and the combiner 11.

Figure 14:
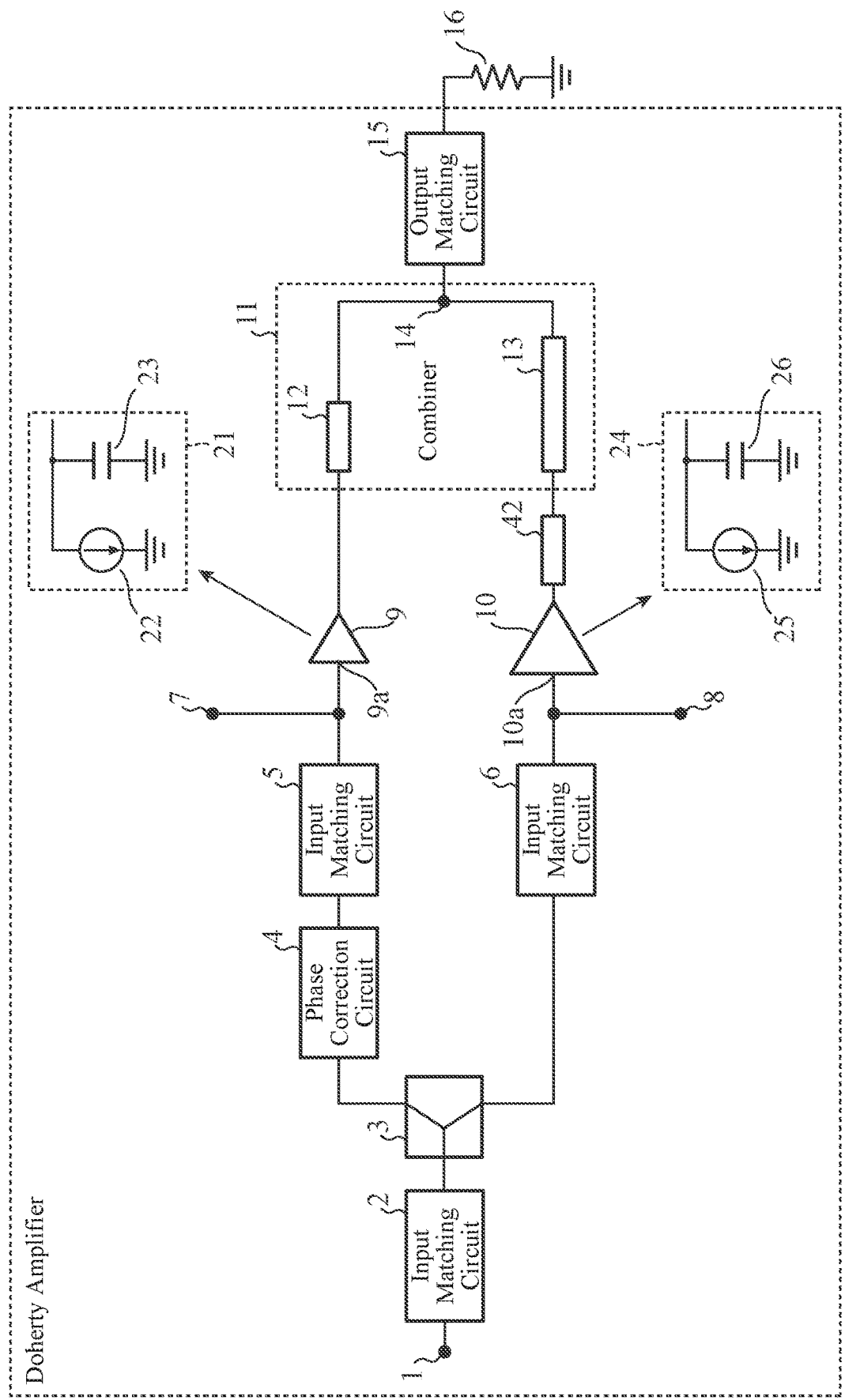
FIG. 14 is a configuration diagram illustrating another Doherty amplifier according to the fourth embodiment.

FIG. 14 is a configuration diagram illustrating another Doherty amplifier according to the fourth embodiment.

In the Doherty amplifier illustrated in FIG. 14, the transmission line 42 is applied to the Doherty amplifier illustrated in FIG. 1. However, this is merely an example, and the transmission line 42 may be applied to the Doherty amplifier illustrated in FIG. 12.

Note that the present disclosure may include a flexible combination of the embodiments, a modification of any component of the embodiments, or omission of any component in the embodiments.

INDUSTRIAL APPLICABILITY

The present disclosure is suitable for a Doherty amplifier.

REFERENCE SIGNS LIST

1: Input terminal, 2: Input matching circuit, 3: Divider, 4: Phase correction circuit, 5: Input matching circuit, 6: Input matching circuit, 7: Bias terminal, 8: Bias terminal, 9: First amplifier, 9a: Gate terminal, 10: Second amplifier, 10a: Gate terminal, 11: Combiner, 12: First output circuit, 13: Second output circuit, 14: Output combining point, 15: Output matching circuit, 16: Load, 21: Output equivalent circuit, 22: Current source, 23: Capacitor, 24: Output equivalent circuit, 25: Current source, 26: Capacitor, 31 and 32: Input terminal, 33: First amplifier, 33a: Gate terminal, 34: Second amplifier, 34a: Gate terminal, 41 and 42: Transmission line, 51: Series inductor, 52: Parallel inductor, 53: Series capacitor, 54: Series inductor, 55: Parallel inductor, 56: Series capacitor

What is claimed is:

1. A Doherty amplifier comprising:
   a first amplifier to amplify a first signal as an auxiliary amplifier in a case where a frequency of each of the first signal and a second signal is a first frequency, and amplify the first signal as a main amplifier in a case where the frequency of each of the first signal and the second signal is a second frequency;
   a second amplifier to amplify the second signal as a main amplifier in a case where the frequency of each of the first signal and the second signal is the first frequency, and amplify the second signal as an auxiliary amplifier in a case where the frequency of each of the first signal and the second signal is the second frequency; and
   a combiner to synthesize the first signal amplified by the first amplifier and the second signal amplified by the second amplifier,
   wherein the second amplifier has a saturated output power which is larger than a saturated output power of the first amplifier, and
   in a case where the first amplifier amplifies the first signal as the main amplifier and the second amplifier amplifies the second signal as the auxiliary amplifier, the combiner transforms output impedance of the first amplifier so that an imaginary component in the output impedance of the first amplifier is reduced,
   the combiner reduces an output reflection coefficient of the first amplifier by transforming the output impedance of the first amplifier in a case where the first amplifier amplifies the first signal as the main amplifier and the second amplifier amplifies the second signal as the auxiliary amplifier, as compared with an output reflection coefficient of the first amplifier in a case where the first amplifier amplifies the first signal as the auxiliary amplifier and the second amplifier amplifies the second signal as the main amplifier, and
   a reduction amount of the output reflection coefficient based on a difference between the output reflection coefficient of the first amplifier in a case where the first amplifier amplifies the first signal as the main amplifier and the second amplifier amplifies the second signal as the auxiliary amplifier and the output reflection coefficient of the first amplifier in a case where the first amplifier amplifies the first signal as the auxiliary amplifier and the second amplifier amplifies the second signal as the main amplifier, is smaller than an increased amount of the output reflection coefficient of the first amplifier due to a difference between the saturated output power of the first amplifier and the saturated output power of the second amplifier.

2. The Doherty amplifier according to claim 1, further comprising a transmission line connected between an output side of the first amplifier and the combiner or between an output side of the second amplifier and the combiner, the transmission line having an electrical length of an integral multiple of 180 degrees at the frequency of each of the first signal and the second signal.

3. The Doherty amplifier according to claim 1, wherein the combiner transforms output impedance of the second amplifier so that an imaginary component in the output impedance of the second amplifier is reduced in a case where the first amplifier amplifies the first signal as an auxiliary amplifier and the second amplifier amplifies the second signal as a main amplifier.

4. The Doherty amplifier according to claim 3, wherein the combiner increases an output reflection coefficient of the second amplifier by transforming the output impedance of the second amplifier in a case where the first amplifier amplifies the first signal as an auxiliary amplifier and the second amplifier amplifies the second signal as a main amplifier, as compared with an output reflection coefficient of the first amplifier in a case where the first amplifier amplifies the first signal as the main amplifier and the second amplifier amplifies the second signal as the auxiliary amplifier, and
an increased amount of the output reflection coefficient based on a difference between the output reflection coefficient of the first amplifier in a case where the first amplifier amplifies the first signal as the main amplifier and the second amplifier amplifies the second signal as the auxiliary amplifier and the output reflection coefficient of the first amplifier in a case where the first amplifier amplifies the first signal as the auxiliary amplifier and the second amplifier amplifies the second signal as the main amplifier is larger than a reduction amount of the output reflection coefficient of the second amplifier due to a difference between the saturated output power of the first amplifier and the saturated output power of the second amplifier.

5. The Doherty amplifier according to claim 3, wherein the combiner comprises:
   a first output circuit having a first end connected with an output side of the first amplifier; and
   a second output circuit having a first end connected with an output side of the second amplifier and a second end connected with a second end of the first output circuit,
   the first output circuit has an electrical length shorter than 90 degrees in a case where the frequency of each of the first signal and the second signal is the first frequency and has an electrical length of 90 degrees in a case where the frequency of each of the first signal and the second signal is the second frequency, and
   the second output circuit has an electrical length longer than 90 degrees in a case where the frequency of each of the first signal and the second signal is the first frequency and has an electrical length of 180 degrees in a case where the frequency of each of the first signal and the second signal is the second frequency.

6. The Doherty amplifier according to claim 3, wherein the first amplifier amplifies the first signal as an auxiliary amplifier and the second amplifier amplifies the second signal as a main amplifier in a case where the frequency of each of the first signal and the second signal is a third frequency, and the combiner transforms the output impedance of the second amplifier so that the imaginary component in the output impedance of the second amplifier is reduced in a case where the frequency of each of the first signal and the second signal is the third frequency, the first amplifier amplifies the first signal as an auxiliary amplifier, and the second amplifier amplifies the second signal as a main amplifier.

7. The Doherty amplifier according to claim 6, wherein the combiner increases the output reflection coefficient of the second amplifier by transforming the output impedance of the second amplifier in a case where the frequency of each of the first signal and the second signal is the third frequency, the first amplifier amplifies the first signal as an auxiliary amplifier and the second amplifier amplifies the second signal as a main amplifier, as compared with an output reflection coefficient of the first amplifier in a case where the first amplifier amplifies the first signal as the main amplifier and the second amplifier amplifies the second signal as the auxiliary amplifier, and an increased amount of the output reflection coefficient based on a difference between the output reflection coefficient of the first amplifier in a case where the first amplifier amplifies the first signal as the main amplifier and the second amplifier amplifies the second signal as the auxiliary amplifier and the output reflection coefficient of the first amplifier in a case where the first amplifier amplifies the first signal as the auxiliary amplifier and the second amplifier amplifies the second signal as the main amplifier, is larger than a reduction amount of the output reflection coefficient of the first amplifier due to a difference between the saturated output power of the first amplifier and the saturated output power of the second amplifier.

8. The Doherty amplifier according to claim 6, wherein the combiner comprises:

a first output circuit having a first end connected with an output side of the first amplifier; and a second output circuit having a first end connected with an output side of the second amplifier and a second end connected with a second end of the first output circuit, the first output circuit has an electrical length shorter than 90 degrees in a case where the frequency of each of the first signal and the second signal is the first frequency, has an electrical length of 90 degrees in a case where the frequency of each of the first signal and the second signal is the second frequency, and has an electrical length greater than or equal to 90 degrees in a case where the frequency of each of the first signal and the second signal is the third frequency, and the second output circuit has an electrical length longer than 90 degrees in a case where the frequency of each of the first signal and the second signal is the first frequency, has an electrical length of 180 degrees in a case where the frequency of each of the first signal and the second signal is the second frequency, and has an electrical length shorter than 270 degrees in a case where the frequency of each of the first signal and the second signal is the third frequency.

9. The Doherty amplifier according to claim 1, wherein the first amplifier amplifies the first signal as an auxiliary amplifier when a bias voltage lower than a threshold voltage is applied in a case where the frequency of each of the first signal and the second signal is the first frequency and amplifies the first signal as a main amplifier when a bias voltage greater than or equal to the threshold voltage is applied in a case where the frequency of each of the first signal and the second signal is the second frequency; and the second amplifier amplifies the second signal as a main amplifier when a bias voltage greater than or equal to a threshold voltage is applied in a case where the frequency of each of the first signal and the second signal is the first frequency and amplifies the second signal as an auxiliary amplifier when a bias voltage lower than the threshold voltage is applied in a case where the frequency of each of the first signal and the second signal is the second frequency.

10. The Doherty amplifier according to claim 1, wherein the first signal and the second signal originate from corresponding separate signal sources, the first amplifier amplifies the first signal as an auxiliary amplifier in a case where the frequency of each of the first signal and the second signal is the first frequency and power of the first signal is less than power of the second signal and amplifies the first signal as a main amplifier in a case where the frequency of each of the first signal and the second signal is the second frequency and the power of the first signal is greater than the power of the second signal, and the second amplifier amplifies the second signal as a main amplifier in a case where the frequency of each of the first signal and the second signal is the first frequency and the power of the second signal is greater than the power of the first signal and amplifies the second signal as an auxiliary amplifier in a case where the frequency of each of the first signal and the second signal is the second frequency and the power of the second signal is less than the power of the first signal.

* * * * *